United States Patent [19]

Yoon et al.

[11] Patent Number: 5,688,724
[45] Date of Patent: Nov. 18, 1997

[54] METHOD OF PROVIDING A DIELECTRIC STRUCTURE FOR SEMICONDUCTOR DEVICES

[75] Inventors: Euisik Yoon, Sunnyvale; Ronald P. Kovacs, Mountain View; Michael E. Thomas, Milpitas, all of Calif.

[73] Assignee: National Semiconductor Corporation, Santa Clara, Calif.

[21] Appl. No.: 363,972

[22] Filed: Dec. 23, 1994

Related U.S. Application Data

[60] Continuation of Ser. No. 88,312, Jul. 7, 1993, abandoned, which is a division of Ser. No. 907,915, Jul. 2, 1992, abandoned.

[51] Int. Cl.$^6$ .................................................. H01L 21/02
[52] U.S. Cl. .................... 437/235; 437/47; 437/52; 437/60; 437/919; 148/DIG. 14
[58] Field of Search ........................ 437/47, 48, 52, 437/60, 235, 237, 919, 978; 148/DIG. 43, DIG. 14; 237/310

[56] References Cited

U.S. PATENT DOCUMENTS

| | | | |
|---|---|---|---|
| 3,668,004 | 6/1972 | Yamamoto et al. | 257/635 |
| 3,730,766 | 5/1973 | Nishimatsu et al. | 257/637 |
| 3,967,310 | 6/1976 | Horiachi et al. | 257/637 |
| 4,335,391 | 6/1982 | Morris | 437/978 |
| 4,495,219 | 1/1985 | Kato et al. | 437/919 |
| 4,636,833 | 1/1987 | Nishioka et al. | |
| 4,659,606 | 4/1987 | Wada et al. | 428/141 |
| 4,690,846 | 9/1987 | Wada et al. | 428/64 |
| 4,891,684 | 1/1990 | Nishioka et al. | 357/51 |
| 4,937,650 | 6/1990 | Shinriki et al. | |
| 4,989,056 | 1/1991 | Hiraiwa et al. | 357/23.6 |
| 5,072,269 | 12/1991 | Hieda | 357/23.6 |
| 5,091,761 | 2/1992 | Hiraiwa et al. | 357/23.6 |
| 5,111,355 | 5/1992 | Anand et al. | |
| 5,173,835 | 12/1992 | Cornett et al. | 257/310 |
| 5,225,286 | 7/1993 | Fujikawa et al. | 428/426 |

FOREIGN PATENT DOCUMENTS

| | | | |
|---|---|---|---|
| 52-58490 | 5/1977 | Japan | 257/637 |
| 145854 | 7/1986 | Japan | 257/310 |
| 219659 | 9/1987 | Japan | |
| 62-209832 | 9/1987 | Japan | 437/978 |
| 62-242331 | 10/1987 | Japan | 437/978 |
| 4-184932 | 7/1992 | Japan | 437/978 |

OTHER PUBLICATIONS

Shinriki & Nakata, "UV–$O_3$ and Dry–$O_2$: Two Step Annealed Chemical Vapor–deposited $Ta_2 O_5$ Films for Storage Dielectrics of 64–Mb DRAM's", IEEE Transactions on Electron Devices, vol. 38, No. 3, Mar. 1991, pp. 455–462.

*Primary Examiner*—Tuan H. Nguyen
*Attorney, Agent, or Firm*—Limbach & Limbach L.L.P.

[57] ABSTRACT

A dielectric structure on a substrate includes a primary dielectric layer on the substrate, the primary dielectric being a metal oxide, such as tantalum pentoxide, having a high dielectric constant, and a secondary dielectric layer, such as an oxide or nitride of silicon, on the primary dielectric layer. In one embodiment, a multi-layer structure includes a second primary dielectric layer disposed on the secondary dielectric layer, and a second secondary dielectric layer disposed on the second primary dielectric layer, each primary dielectric layer being in a first crystalline state characterized by low leakage current for a given applied electrical field. A method of forming a dielectric structure on a substrate includes forming a layer of a primary dielectric, which is a metal oxide having a high dielectric constant, forming a secondary dielectric layer on the primary dielectric layer, and annealing the primary dielectric layer.

18 Claims, 9 Drawing Sheets

1

METHOD OF PROVIDING A DIELECTRIC STRUCTURE FOR SEMICONDUCTOR DEVICES

This is a continuation of application Ser. No. 08/088,312 filed on Jul. 7, 1993, now abandoned, which is is a divisional of application Ser. No. 07/907,915 filed on Jul. 2, 1992, now abandoned.

BACKGROUND OF THE INVENTION

This invention relates to semiconductor devices and in particular to dielectric structures in semiconductor devices such as gates and capacitors.

Tantalum oxide, specifically tantalum pentoxide ($Ta_2O_5$), is known as a desirable material for dielectrics in semiconductor devices because of its high dielectric constant, of approximately 25. This high dielectric constant makes possible tantalum pentoxide devices having a much smaller area than silicon dioxide devices having the same storage capacity. This material can be used for gate dielectrics for MOS transistors to achieve high transconductance. For example, in the memory components of high density dynamic random access memories (DRAM's) especially above 64 megabytes, the use of tantalum pentoxide is common. Volatile memories, such as DRAM's, have a maximum voltage differential across the capacitor of 1.5 volts, which may be achieved in DRAM elements having tantalum pentoxide dielectric thicknesses of up to 100 Angstroms.

However, in non-volatile memories, such as erasable-programmable read only memories (EPROMS), higher voltages, typically above 12 volts, are required. As a result, the tantalum pentoxide layer must have a greater thickness, typically 400 Angstroms or more.

A tantalum pentoxide layer is conventionally formed by chemical vapor deposition or physical vapor deposition. In most applications, it is necessary or desirable to include high-temperature processing steps, above 800 degrees Celsius, after the forming of the tantalum pentoxide layer. Tantalum pentoxide, upon deposition, is in an amorphous phase, and has a smooth surface. Deposited tantalum pentoxide must be stabilized prior to high-temperature cycles by annealing in oxygen at high temperature to optimize the breakdown strength and leakage characteristics of the dielectric.

Stabilization of the tantalum pentoxide layer is accomplished by annealing. Annealing is carried out, typically, in an oxygen, ozone or nitrogen atmosphere. During the oxygen annealing of $Ta_2O_5$, any tantalum atom that has a local oxygen deficiency will have extra oxygen atoms provided to correct the $Ta_2O_5$ stoichiometry and stabilize the film.

During the annealing step, the $Ta_2O_5$ also undergoes a phase transformation from an amorphous state to a polycrystalline state. It has been found that relatively thick tantalum pentoxide layers, such as those having a thickness of 400 Angstroms and greater, exhibit a relatively large leakage current for a given applied field after annealing. It has also been observed that such relatively thick tantalum pentoxide layers have a relatively large grain size and a relatively rough surface after annealing. By contrast, relatively thin tantalum pentoxide layers, having a thickness of 100 Angstroms or less, are observed to permit a much lower leakage current for a given applied field. Such relatively thin tantalum pentoxide layers have also been observed by the inventors to have a fine grain size and a relatively smooth surface, compared to layers having thickness of 400 Angstroms and greater.

It has been observed by the inventors that $Ta_2O_5$ films below a critical thickness, which is slightly in excess of 100 Angstroms, have a first crystalline state characterized by a leakage current mechanism which provides a relatively low leakage current for a given applied electrical field. It has been observed by the inventors that $Ta_2O_5$ films in excess of the critical thickness have a second crystalline state characterized by a relatively large grain size. The second crystalline state is believed to have a different leakage current mechanism, which provides a relatively high leakage current for a given applied field.

As a result of the relatively large leakage current, tantalum pentoxide layers having thicknesses of 400 Angstroms and greater are not desirable if high-temperature steps inherent in the device fabrication must follow deposition of the tantalum pentoxide. A large leakage current subsequent to a high temperature thermal process will result in a device which is undesirable. The higher leakage current will result in the relatively fast loss of data in a non-volatile memory.

In commonly-assigned co-pending United States patent application Ser. No. 07/747,663, there is disclosed a process for forming a gate dielectric especially for EPROM cells, comprising tantalum pentoxide, in which tantalum pentoxide is deposited in the later stages of the fabrication process. By depositing tantalum pentoxide in a back-end process, degradation of the tantalum pentoxide during high-temperature processing steps is avoided. However, this process requires that the control gates only be formed after all high-temperature processing steps.

It is accordingly an object of this invention to provide a dielectric structure, using a metal oxide having a stable high effective dielectric constant, which is retained after high temperature processing and exhibits a low leakage current.

Additional objects and advantages of the invention will become evident from the detailed description of a preferred embodiment below.

SUMMARY OF THE INVENTION

A dielectric structure provided on a semiconductor substrate includes a first primary dielectric layer on the substrate, the primary dielectric being a metal oxide having a high dielectric constant, and a first secondary dielectric layer on the first primary dielectric layer.

A method of providing a dielectric structure on a semiconductor substrate includes the steps of providing a first layer of a primary dielectric, the primary dielectric being a metal oxide having a high dielectric constant, providing a first layer of a secondary dielectric on the first primary dielectric layer, and annealing the first layer of the primary dielectric.

A dielectric structure on a substrate includes a secondary dielectric layer on the substrate, and a primary dielectric layer on the secondary dielectric layer, the primary dielectric being selected from the group consisting of $Nb_2O_5$, $Al_2O_3$, and $TiO_2$.

A dielectric structure on a substrate includes a secondary dielectric layer on the substrate, the secondary dielectric being selected from the group consisting of $TiO_2$ and $Al_2O_3$, and a primary dielectric layer on the secondary dielectric layer, the primary dielectric being a metal oxide having a high dielectric constant.

DETAILED DESCRIPTION OF A PREFERRED EMBODIMENT

Figure 1:
FIG. 1 is a sectional view of a substrate prior to a first step of a method according to the invention.

With reference to FIG. 1, there is shown a substrate 10 prior to the first step of a method according to the invention. Substrate 10 may be a single crystal silicon substrate or a polycrystalline silicon substrate, or a metal electrode, as is conventional in the manufacture of integrated circuits.

Figure 2:
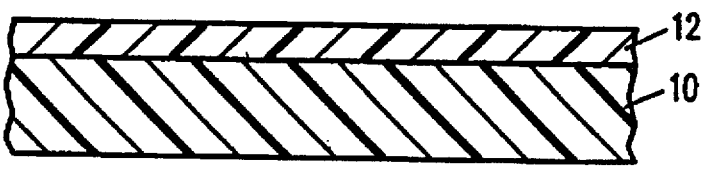
FIG. 2 is a sectional view, similar to FIG. 1, after a step of providing a first secondary dielectric layer.

With reference to FIG. 2, there is shown substrate 10 with dielectric layer 12 formed thereon. If substrate 10 is of silicon, dielectric layer 12 may be silicon dioxide. Other dielectrics may be used for dielectric layer 12. The dielectric making up layer 12 will be referred to as a secondary dielectric. Dielectric layer 12 will be referred to as first secondary dielectric layer. Conventional formation methods, such as low temperature thermal oxidation or low temperature CVD deposition, may be used to form first secondary dielectric layer 12.

In addition to $SiO_2$, first secondary dielectric layer 12 may be formed of $Si_3N_4$. It should also be possible to form first secondary dielectric layer 12 of other dielectrics, such as $TiO_2$ or $Al_2O_3$. The thickness of first secondary dielectric layer 12 is preferably from about 10 Angstroms to about 30 Angstroms. The minimum thickness of first secondary dielectric layer 12 is a thickness sufficient to reduce leakage current in a dielectric structure, as will be explained below. It is desirable that first secondary dielectric layer 12 be as thin as possible, consistent with effecting a desired reduction in leakage current, as, the greater the thickness of first secondary dielectric layer 12, the less effective the overall dielectric constant of the dielectric structure.

Figure 3:
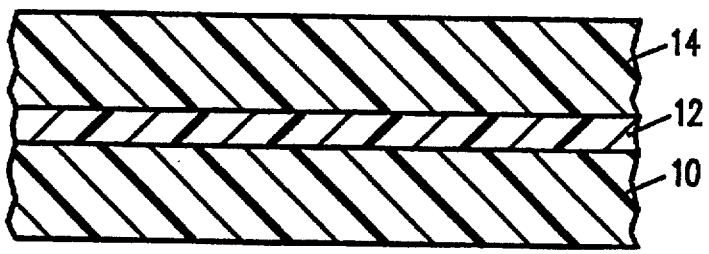
FIG. 3 is a sectional view, similar to FIG. 2, after a step of providing a first primary dielectric layer.

Referring now to FIG. 3, there is formed on first secondary dielectric layer 12 a first primary dielectric layer 14, which is preferably $Ta_2O_5$. First $Ta_2O_5$ layer 14 is preferably formed by a chemical vapor deposition (CVD) process. Specifically, first $Ta_2O_5$ dielectric layer 14 may be formed by a low temperature low-pressure CVD (LPCVD) process, at 400°–550° Celsius, for preferably five minutes using tantalum ethoxide precursor which is reactive with oxygen. Alternatively, physical vapor deposition could be used to generate these films. The thickness of first $Ta_2O_5$ layer 14 is selected depending on the desired effective dielectric constant to be obtained. For example, the thickness of first $Ta_2O_5$ dielectric layer 14 may be in the range from about 100 Angstroms to about 400 Angstroms. The thickness, by way of specific example, may be about 300 Angstroms. It is believed that the thickness of first $Ta_2O_5$ layer 14 may be from about 10 to about 1000 Angstroms. The first $Ta_2O_5$ dielectric layer 14 is then annealed and thoroughly oxidized in a conventional furnace using oxygen, ozone or an inert gas. The annealing process preferably takes place in an oxygen ambient at a temperature above 600° Celsius, and is preferably performed at approximately 800° Celsius. Annealing in ozone can take place at substantially lower temperatures, such as 350° Celsius. The first $Ta_2O_5$ dielectric layer 14 is preferably annealed in ozone at 300°–400° Celsius for 30 minutes.

$Ta_2O_5$ is the primary dielectric in the illustrated embodiments. However, as noted below, it is believed that other metal oxides having a high dielectric constant, such as $Nb_2O_5$, $TiO_2$, and $Al_2O_3$, may also be selected as the primary dielectric within the scope of the invention. Layers of $Nb_2O_5$, $TiO_2$, and $Al_2O_3$, may be formed by chemical vapor deposition or physical vapor deposition. If $TiO_2$ or $Al_2O_3$ is selected as the primary dielectric, a chemically-different secondary dielectric must be selected.

Figure 4:
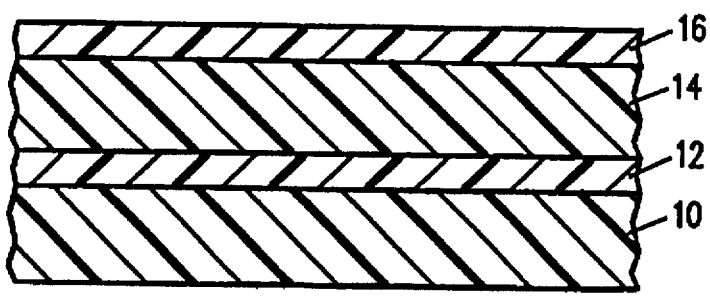
FIG. 4 is a sectional view, similar to FIG. 3, after a step of providing a second secondary dielectric layer.

Referring to FIG. 4, there is then formed on first $Ta_2O_5$ layer 14, after the step of annealing, second secondary dielectric layer 16. Second secondary dielectric layer 16 may be any one of a large number of different dielectric substances. For example, second secondary dielectric layer 16 may be an oxide of silicon or a nitride of silicon similar to layer 12. The dielectric which makes up second secondary dielectric layer 16 may generally be referred to as a secondary dielectric. There is no requirement that the secondary dielectric of first secondary dielectric layer 12 be the same as the secondary dielectric of second secondary dielectric layer 16. In one preferred embodiment, the secondary dielectric layer 16 is $Si_3N_4$. The $Si_3N_4$ may be deposited by low-temperature chemical vapor deposition techniques. By way of further example, second secondary dielectric layer 16 may be of $Si_3N_4$, which may be about 50 Angstroms in thickness, and deposited using low temperature chemical vapor deposition techniques.

Figure 5:
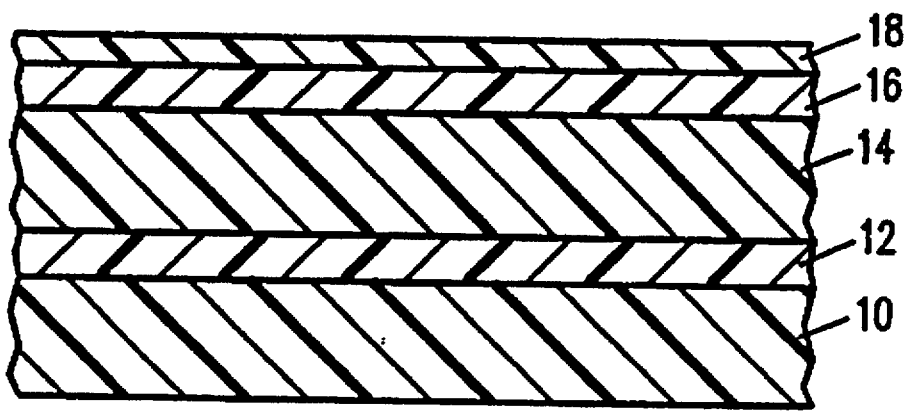
FIG. 5 is a sectional view, similar to FIG. 4, after a step of reoxidation.

Referring to FIG. 5, there is an illustrated an optional step. This optional step involves the simultaneous oxidation and annealing of the structure in an oxygen atmosphere. In this step of oxidation or annealing, there is formed, in a thin top layer of second secondary dielectric layer 16, an oxidized dielectric layer 18. Oxidized dielectric layer 18 will be silicon dioxide, if second secondary dielectric layer 16 is an oxide or nitride of silicon. It should be noted that the forming of oxidized dielectric layer 18 is optional. The annealing step preferably takes place in an oxygen atmosphere for 30 minutes at a temperature from about 600° Celsius to about 1000° Celsius. In addition to forming the oxidized layer 18, the oxidation process anneals $Ta_2O_5$ layer 14. The annealing process allows damage and defects to be eliminated from the layer due to thermal rearrangement of the atoms in the film. Annealing of $Ta_2O_5$ layer 14 takes places because oxygen diffuses through second secondary dielectric layer 16.

It should be noted that it is believed to be possible to anneal first $Ta_2O_5$ layer 14 by annealing after deposition of second secondary dielectric layer 16. If this is correct, then the step of annealing first $Ta_2O_5$ layer 14 prior to deposition of second secondary dielectric layer 16 is not necessary. The annealing of first $Ta_2O_5$ dielectric layer 14 through second secondary dielectric layer 16 will only be successful if there is sufficient diffusion of oxygen through second secondary layer 16 during the oxygen annealing step. It is believed to be within the level of skill in the art to select a dielectric for second secondary dielectric layer 16, and a suitable annealing technique, to provide sufficient diffusion of oxygen into the structure.

Figure 6:
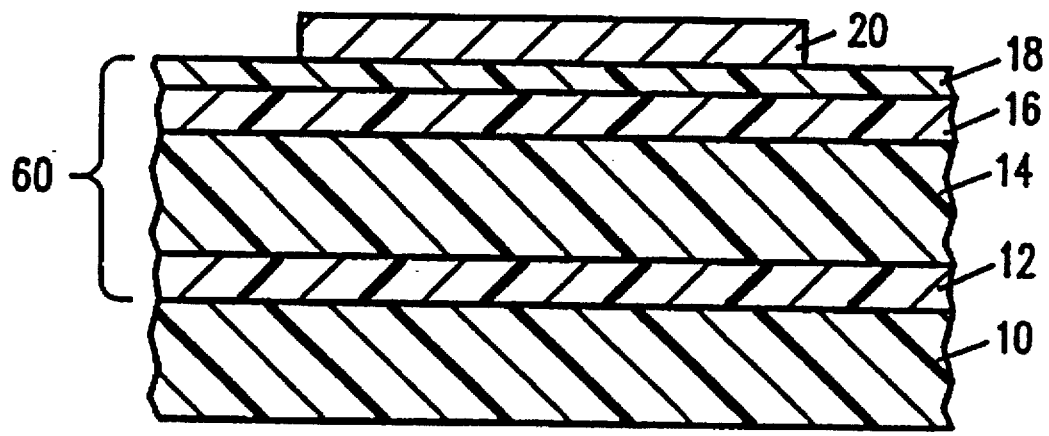
FIG. 6 is a sectional view, similar to FIG. 5, after a step of providing an electrode.

With reference to FIG. 6, there is shown electrode 20 provided on second secondary dielectric layer 16. Electrode 20 is conventionally metal or doped polysilicon and is formed by conventional metallization (or polysilicon deposition and doping) and patterning techniques. Electrode 20 may comprise any one of a number of metals conventionally used for electrodes. For example, electrode 20 may consist of tungsten, tantalum, titanium nitride, tantalum nitride or aluminum.

Second secondary dielectric layer 16 is advantageous during the metallization step in the forming of electrode 20. Second secondary dielectric layer 16 serves as a diffusion barrier against diffusion of the electrode metals or dopant in the polysilicon into first $Ta_2O_5$ layer 14.

Continuing to refer to FIG. 6, first secondary dielectric layer 12, first $Ta_2O_5$ layer 14, and second secondary dielectric layer 16, which may optionally include oxidized dielectric layer 18, comprise dielectric structure 60. It has been found that dielectric structure 60 provides a high dielectric constant between substrate 10 and electrode 20, with a low leakage current. Dielectric structure 60, comprising first secondary dielectric layer 12, $Ta_2O_5$ dielectric layer 14, and second secondary dielectric layer 16, either including or without oxidized dielectric layer 18, is a dielectric structure which may be used in gates and other devices formed on a semiconductor substrate. Dielectric structure 60 is characterized by a high dielectric constant, in comparison to dielectric structures of the same dimensions comprised solely of silicon dioxide, and a low leakage current, when compared to dielectric structures comprised solely of tantalum pentoxide. As first $Ta_2O_5$ dielectric layer 14 has been stoichiometrically stabilized by annealing in an oxidizing ambient, dielectric structure 60 will retain its dielectric strength during subsequent high temperature processes.

By way of example, the structure of FIG. 6 may have the following dimensions. The thickness of first secondary dielectric layer 12 may be about 20 Angstroms. The thickness of $Ta_2O_5$ layer 14 may be about 300 Angstroms. The thickness of second secondary dielectric layer 16, including reoxidized layer 18, may be 40 Angstroms. The equivalent thickness of silicon dioxide having a capacitance equal to the previously described structure is 110 Angstroms. The effective dielectric constant is approximately 13. It will be understood that the thickness of $Ta_2O_5$ layer 14 may be anywhere in the range from about 50 to about 1000 Angstroms. Second secondary dielectric layer 16 may be of silicon dioxide, and may have a thickness in the range from about 10 to about 40 Angstroms. The composite nature of dielectric structure 60 provides a relatively low leakage current.

Figure 7:
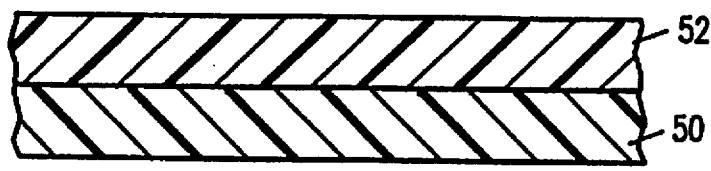
FIG. 7 is a sectional view of a process step in a method according to an alternative embodiment of the invention.

Referring to FIGS. 7 to 10, there will be described an embodiment of a method according to the invention in which an interface oxide, or first secondary dielectric layer interposed between a substrate and a primary dielectric layer is provided during an annealing process. In FIG. 7, there is shown a substrate 50 have a primary dielectric layer 52 formed thereon. Substrate 50 may be a single crystal silicon substrate, a polycrystalline silicon substrate or a metal substrate.

Primary dielectric layer 52 is of a metal oxide having a high dielectric constant, preferably tantalum pentoxide. Primary dielectric layer 52, if formed of $Ta_2O_5$, is preferably deposited by CVD techniques as described above in connection with FIG. 3.

Figure 8:
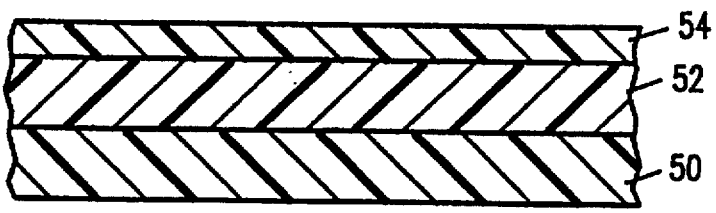
FIG. 8 is a sectional view, similar to FIG. 7, after a step of forming a secondary dielectric layer.

Referring to FIG. 8, there is shown a secondary dielectric layer 54 formed on primary dielectric layer 52. Secondary dielectric layer 54 may be of any one of a number of dielectrics, including $SiO_2$, $Si_3N_4$, $TiO_2$, and $Al_2O_3$. Secondary dielectric layer 54 may be formed by conventional formation methods, such as low temperature CVD deposition. Secondary dielectric layer 54 may have a thickness of about 20 to about 50 Angstroms, and preferably a thickness of about 20 Angstroms.

Figure 9:
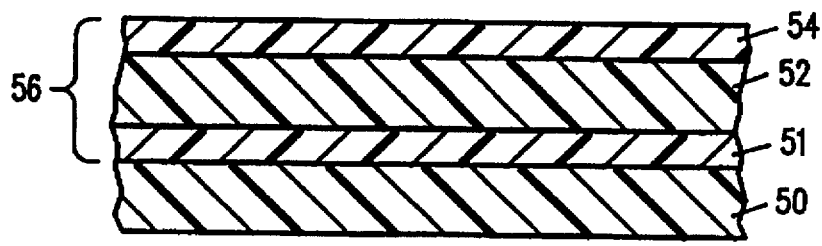
FIG. 9 is a sectional view, similar to FIG. 8, after a step of annealing.
Figure 10:
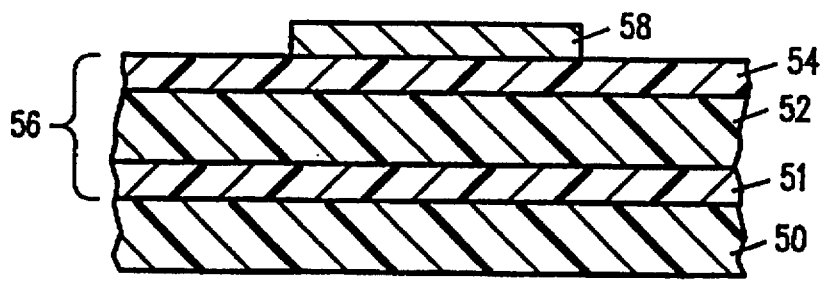
FIG. 10 is a sectional view, similar to FIG. 9, after a step of providing an electrode.

The next step is the simultaneous annealing of the structure in an oxygen-bearing ambient and formation of an interface oxide. Referring to FIG. 9, there is shown a structure according to the invention after the step of annealing in any oxygen-bearing ambient. Layer 51, formed on substrate 50 and between substrate 50 and primary dielectric layer 52, is a secondary dielectric layer. Secondary dielectric layer 51 may be referred to as an interface dielectric layer, or an interface oxide layer. Secondary dielectric layer 51 is formed as a result of oxidation, during the annealing process, of the material forming the substrate. Such oxidation is possible because oxygen will diffuse through secondary dielectric layer 54 and primary dielectric layer 52. The thickness of interface secondary dielectric layer 51 can be no more than about 30 Angstroms when formed during the step of annealing. The annealing process preferably is performed in an oxygen ambient at approximately 600° Celsius to 1000° Celsius for about 30 minutes. The annealing process also thoroughly oxidizes $Ta_2O_5$ layer 52, thereby causing $Ta_2O_5$ layer 52 to be stoichiometrically stabilized. Thus dielectric structure 56 comprises interface secondary dielectric layer 51, primary dielectric layer 52, and secondary dielectric layer 54. Referring to FIG. 10, an electrode 58 may be provided, if desired, on secondary dielectric layer 54 by conventional deposition and patterning techniques.

Dielectric structure 56 provides a high dielectric constant between substrate 50 and electrode 58, with a low leakage current, when compared to dielectric structures comprised solely of tantalum pentoxide. Dielectric structure 56 will retain its dielectric constant during subsequent high temperature processes.

As noted above, the maximum thickness of an interface dielectric layer formed during annealing in an oxygen-bearing ambient is about 30 Angstroms. Nitridation of the surface or a deposited thin nitride film can minimize this oxide formation. Consequently, if it is desired to provide an interface dielectric layer in excess of 30 Angstroms, the layer must be formed, prior to providing a primary dielectric layer, by appropriate oxidation or deposition techniques on the substrate.

Figure 11:
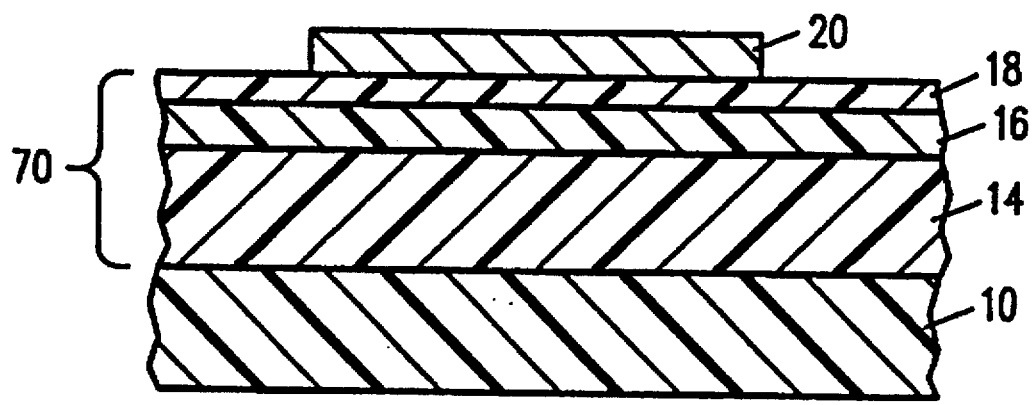
FIG. 11 is a sectional view of an alternative embodiment of a dielectric structure according to the invention.

An alternative embodiment of the invention will now be described with reference to FIG. 11. In FIG. 11, there is provided substrate 10, which is identical to substrate 10 of FIGS. 1–6. There is formed on substrate 10 dielectric structure 70. Electrode 20 is formed on dielectric structure 70.

Dielectric structure 70 comprises $Ta_2O_5$ dielectric layer 14, or primary dielectric layer 14, and secondary dielectric layer 16. $Ta_2O_5$ dielectric layer 14 is formed directly on substrate 10. In contrast to dielectric structure 60 of FIG. 6, there is no first secondary dielectric layer provided between substrate 10 and $Ta_2O_5$ dielectric layer 14. Secondary dielectric layer 16 can comprise optional reoxidized layer 18 formed in an upper portion thereof.

Dielectric structure 70 is made by the same method as dielectric structure 60, except that there is no initial step to form a first secondary dielectric layer on substrate 10. It is possible that an interface will form between substrate 10 and primary dielectric layer 14 during the step of annealing, as a result of reoxidation of secondary dielectric layer 16. The thickness of individual layers in dielectric structure 70 may be the same as those in FIG. 6. Dielectric structure 70 provides a higher effective dielectric constant than a prior art dielectric structure of the same thickness comprising solely silicon dioxide. Dielectric structure 70 is subject to a lower leakage current than a prior art dielectric structure having the same dimensions and comprising solely $Ta_2O_5$.

Figure 12:
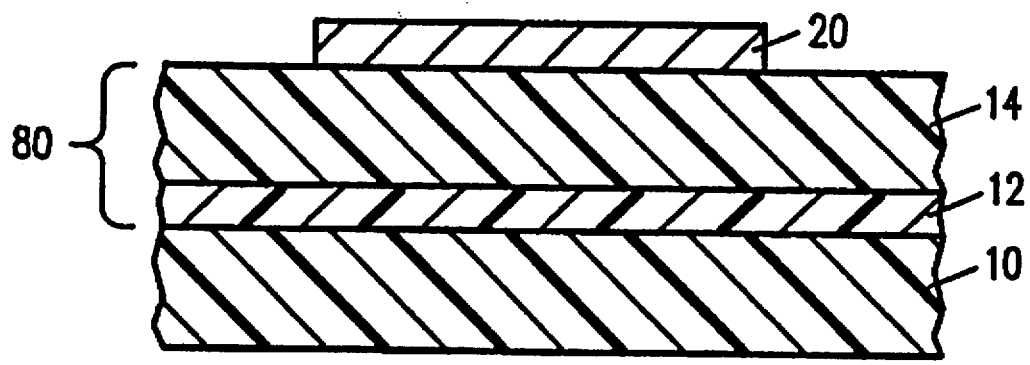
FIG. 12 is a sectional view of an alternative embodiment of a dielectric structure according to the invention.

Referring now to FIG. 12, there is shown another alternative embodiment of the invention. In FIG. 12, there is provided substrate 10, which may comprise the same materials listed above in connection with substrate 10 of FIGS. 1–6. There is provided on substrate 10 dielectric structure 80. Electrode 20 is provided on dielectric structure 80. Dielectric structure 80 includes first secondary dielectric layer 12 formed on substrate 10 and primary dielectric layer 14 formed on first secondary dielectric layer 12. Primary dielectric layer 14 may be of $Nb_2O_5$, $TiO_2$ or $Al_2O_3$. In addition, if secondary dielectric layer 12 is not an oxide or nitride of silicon, primary dielectric layer 14 may be of $Ta_2O_5$. Thus, it will be understood that, by comparison with dielectric structure 60 of FIG. 6, second secondary dielectric layer 16 is omitted. Dielectric structure 80 is in other respects identical to dielectric structure 60 of FIG. 6. Dielectric structure 80 provides a smaller leakage current than that achieved in prior art dielectric structures having the same dimensions and comprising solely a layer of the primary dielectric. However, the leakage current in dielectric structure 80 according to FIG. 8 will generally be greater than the leakage current in dielectric structure 60 according to FIG. 6. In addition, dielectric structure 80 according to FIG. 12 is not preferred because there may be diffusion of metal (or dopants), if a non-optimal metal system is used for electrode 20, during the step of formation of the top electrode, into primary dielectric layer 14. If the diffusion of metal (or dopants) can be inhibited, this structure would be attractive as an alternative embodiment.

Figure 13:
FIG. 13 is a sectional view of a substrate prior to a first step of a method according to the invention.

Referring to FIGS. 13–20, there will now be described an alternative method and dielectric structure according to the invention. In FIG. 13, there is shown substrate 30 before the first step of a process according to the invention. Substrate 30 may be silicon, polysilicon or high-temperature metal, as is conventional in the manufacture of integrated circuits.

Figure 14:
FIG. 14 is a sectional view, similar to FIG. 13, after a step of providing a first secondary dielectric layer.

Referring to FIG. 14, there has been formed on substrate 30 first secondary dielectric layer 32. In a preferred embodiment, first secondary dielectric layer 32 may be $SiO_2$ or $Si_3N_4$. It should also be possible to form first secondary dielectric layer 32 of other dielectrics, such as $TiO_2$, or $Al_2O_3$. The thickness of first secondary dielectric layer 32 is preferably from about 10 Angstroms to about 30 Angstroms. If the substrate 30 is of silicon or polysilicon, first secondary dielectric layer 32 may be provided of silicon dioxide by a low temperature thermal oxidation process. It will be understood by those skilled in the art that other known processes for providing a silicon dioxide layer on the surface of substrate 30 may be provided. For example, a low temperature dry oxidation process or CVD silicon oxide formation may be used.

Figure 15:
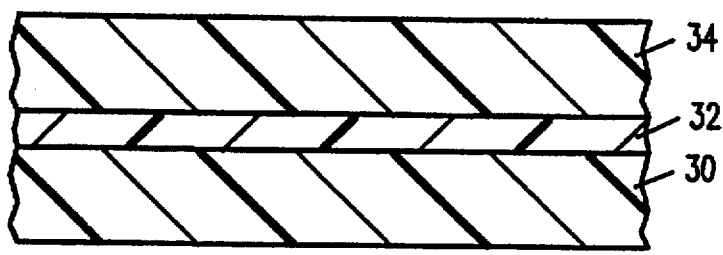
FIG. 15 is a sectional view, similar to FIG. 14, after a step of providing of a first $Ta_2O_5$ dielectric layer.

Referring now to FIG. 15, there is formed on first secondary dielectric layer 32 first $Ta_2O_5$ dielectric layer 34 or first primary dielectric layer 34. First $Ta_2O_5$ dielectric layer 34 may be formed by conventional processes known in the art for forming layers of $Ta_2O_5$. These processes include various low temperature CVD processes. For example, first $Ta_2O_5$ dielectric layer 34 may be deposited by low temperature low pressure CVD ("LPCVD") processes, or by low temperature remote plasma enhanced chemical vapor deposition (RPECVD) processes. It is also possible to use an rapid thermal process chemical vapor deposition (RTPCVD) process, if the process is controlled to last for only a short period of time. Physical vapor deposition is possible, but less attractive. The thickness of first $Ta_2O_5$ dielectric layer 34 should be preferably less than about 100 Angstroms.

After first $Ta_2O_5$ dielectric layer 34 has been formed, it is annealed. The step of annealing may take place in either an oxygen or an ozone atmosphere or both. Before the step of annealing, first $Ta_2O_5$ dielectric layer 34 is in an amorphous state. After the step of annealing, first $Ta_2O_5$ dielectric layer 34 is transformed into a polycrystalline state.

As noted above, it has been found that deposited $Ta_2O_5$ films, after annealing, have characteristic leakage current versus applied field curves that vary with the thickness of the $Ta_2O_5$ film. In particular, $Ta_2O_5$ films having a thickness of approximately 100 Angstroms or less have a relatively small leakage current for a given applied field, while thicker films greater than 200 Angstroms tend to have a sharply higher leakage current for a given applied field. In addition, $Ta_2O_5$ films that have a relatively small leakage current for a given applied field, have a relatively small grain size. $Ta_2O_5$ films that have a relatively high leakage current for a given applied field have a relatively large grain size. The differences in grain size may be observed by appropriate transmission electron microscope examination of the film surface. $Ta_2O_5$ films that have a relatively low leakage current for a given applied field have a relatively smooth surface. $Ta_2O_5$ films that have a higher leakage current for a given applied field have a relatively rough surface. It is not known whether one, two or all three of the characteristics of relative thinness, relatively small grain size, and a relatively smooth surface are critical to obtaining a relatively low leakage current for a given applied electrical field. A $Ta_2O_5$ film that has a relatively low leakage current for a given applied field is in a first crystalline state. By the term "first crystalline state," there is meant a state which possesses whichever of the properties, or combination of the properties, of relative thinness, relatively small grain size, and relatively smooth surface, is critical to obtaining a relatively low leakage current for a given applied field. In a second crystalline state, a $Ta_2O_5$ film has a relatively high leakage current for a given applied field. By the term "second crystalline state," there is meant a state which possesses whichever of the properties, or combination of properties, of relative thickness, relatively large grain size, and relatively rough surface, is critical to obtaining a relatively high leakage current for a given applied field.

The thickness of the first $Ta_2O_5$ dielectric layer 34 should be sufficiently small such that the $Ta_2O_5$ is in the first crystalline state, characterized by a relatively low leakage current for a given applied field. As noted above, the grain size of any $Ta_2O_5$ film may be observed by TEM examination of the film surface. Thus, if grain size is critical to crystalline state, the crystalline state may be determined. For example, an atomic force microscope image of the film surface may be made and studied to determine the surface roughness related to the grain size. It has been observed that a $Ta_2O_5$ film in the first crystalline state has a mean surface roughness of about 2.2 Angstroms. It has been observed that a $Ta_2O_5$ film in the second crystalline state has a mean surface roughness of about 10.2 Angstroms. Thus, if surface roughness is critical to crystalline state, the crystalline state of a $Ta_2O_5$ film can be determined by determining the mean surface roughness of the film. If the mean surface roughness is less than about 5 to 7 Angstroms, assuming surface roughness to be critical to crystalline state, then the $Ta_2O_5$ film is in the first crystalline state, characterized by a low leakage current. If the mean surface roughness of the $Ta_2O_5$ film is greater than about 9 Angstroms, assuming surface roughness to be critical to crystalline state, then the $Ta_2O_5$ film is in the second crystalline state, characterized by a relatively high leakage current. Thus, it can be ascertained whether a $Ta_2O_5$ layer is of the desired polycrystalline state.

Figure 16:
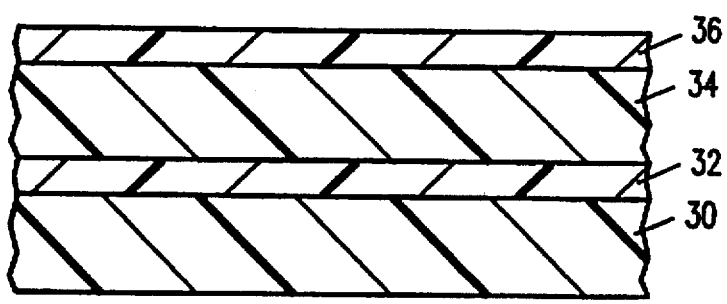
FIG. 16 is a sectional view, similar to FIG. 15, after a step of providing of a second secondary dielectric layer.

Referring now to FIG. 16, there has been formed on first $Ta_2O_5$ dielectric layer 34 second secondary dielectric layer 36. Second secondary dielectric layer 36 may be any one of a number of conventional dielectrics. For example, in a preferred embodiment, second secondary dielectric layer 36 may be of silicon dioxide or silicon nitride. Second secondary dielectric layer 36 may be formed by a chemical vapor deposition process, such as low temperature LPCVD, RPECVD and RTPCVD. The thickness of second secondary dielectric layer 36 may be, for example, in the range of 10 to 30 Angstroms. It is not desirable to provide a thick second secondary dielectric layer 36, much beyond those values since the greater thicknesses of second secondary dielectric layer, the lower the effective dielectric constant of the overall structure formed by this process. Thinner layers can be possibly used, if it is possible to control the thickness. The thickness of the secondary dielectric layer must be great enough so that the two primary dielectric films individually form the first polycrystalline state.

Figure 17:
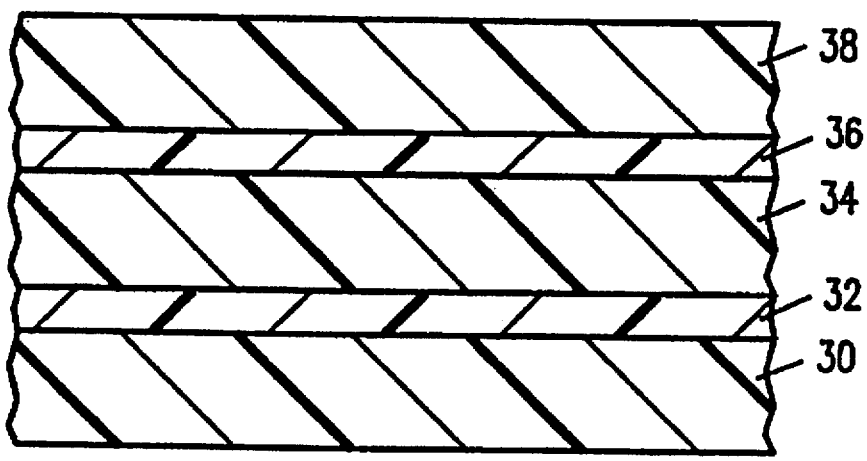
FIG. 17 is a sectional view, similar to FIG. 16, after a step of providing of a second $Ta_2O_5$ dielectric layer.

Referring now to FIG. 17, there is formed on second secondary dielectric layer 36 second $Ta_2O_5$ dielectric layer 38 or second primary dielectric layer 38. Second $Ta_2O_5$ dielectric layer 38 is formed by the same process, preferably a chemical vapor deposition process, as first $Ta_2O_5$ dielectric layer 34 described above. The thickness of second $Ta_2O_5$ dielectric layer 38 is, as with first $Ta_2O_5$ dielectric layer 34, below the threshold thickness at which annealed $Ta_2O_5$ changes from a first polycrystalline state characterized by small grain size to a second polycrystalline state characterized by large grain size. The thickness of second $Ta_2O_5$ dielectric layer 38 is preferably less than about 100 Angstroms. After the step of forming second $Ta_2O_5$ dielectric layer 38, second $Ta_2O_5$ dielectric layer 38 is annealed, as described above, in a conventional manner, in an oxygen or ozone atmosphere. As noted above, the step of annealing in an oxygen-bearing ambient tends to satisfy the oxidation deficiencies of Ta/O ratio required to generate low-leakage high-dielectric constant films. The stability of the $Ta_2O_5$ during later high temperature steps is thereby enhanced by this process.

It will be understood that it is possible to determine whether second $Ta_2O_5$ dielectric layer 38 has a first polycrystalline structure characterized by fine grain size by transmission electron microscopy, through second $Ta_2O_5$ dielectric layer 38. Surface roughness can be evaluated by cross-sectional transmission electron microscopy, or atomic force microscopy.

Figure 18:
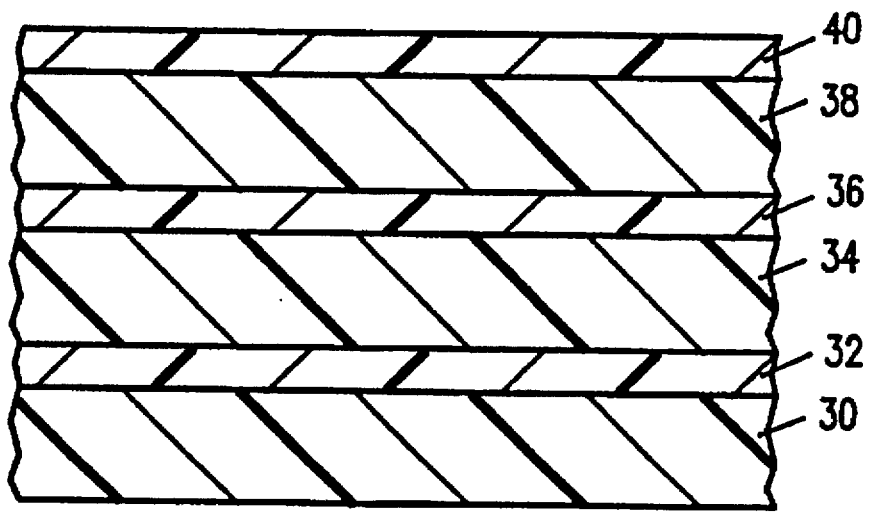
FIG. 18 is a sectional view, similar to FIG. 17, after a step of providing of a third secondary dielectric layer.

Referring now to FIG. 18, third secondary dielectric layer 40 is provided on second $Ta_2O_5$ dielectric layer 38. Third secondary dielectric layer 40 is preferably formed by the same processes as second secondary dielectric layer 36, and preferably comprises the same materials and has the same thickness.

Figure 19:
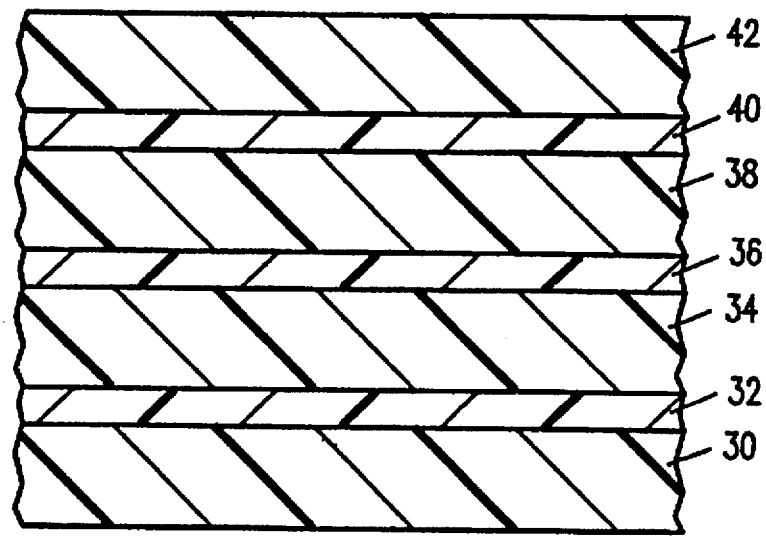
FIG. 19 is a sectional view, similar to FIG. 18, after a step of providing of a third $Ta_2O_5$ dielectric layer.

Referring to FIG. 19, there is formed on third secondary dielectric layer 40 third $Ta_2O_5$ dielectric layer 42 or third primary dielectric layer 42. Third $Ta_2O_5$ dielectric layer 42 may be formed by the same processes as first $Ta_2O_5$ dielectric layer 34. Third $Ta_2O_5$ dielectric layer 42 also has a thickness of preferably less than approximately 100 Angstroms. Third $Ta_2O_5$ dielectric layer may be oxygen or ozone annealed. After the step of annealing in an oxygen-bearing ambient at an elevated temperature preferably between 600° and 1000° Celsius, third $Ta_2O_5$ dielectric layer 42 possesses the first polycrystalline state, characterized by relatively low leakage current. This is the same first polycrystalline state as first $Ta_2O_5$ dielectric layer 34 and second $Ta_2O_5$ dielectric layer 38.

Figure 20:
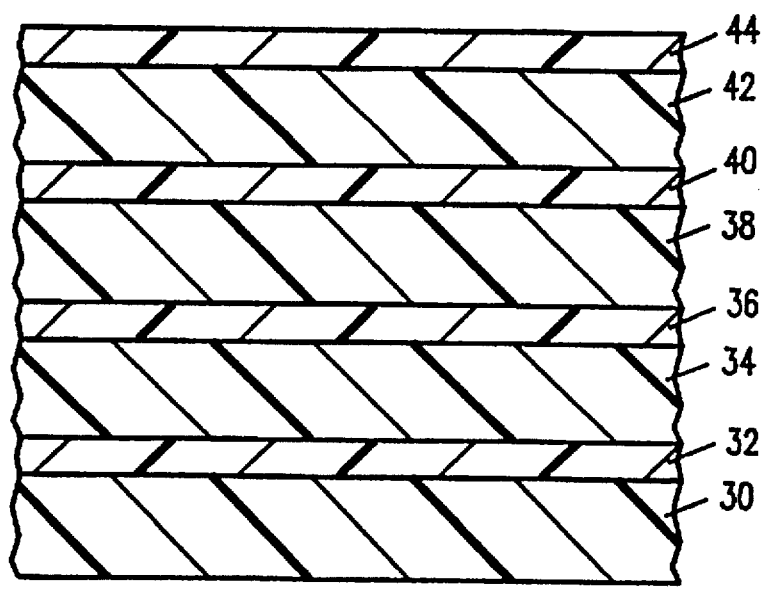
FIG. 20 is a sectional view, similar to FIG. 19, after a step of providing of a final secondary dielectric layer.

Referring to FIG. 20, there is shown final secondary dielectric layer 44 formed on third $Ta_2O_5$ dielectric layer 42. Final secondary dielectric layer 44 is preferably of silicon dioxide, having a thickness of approximately 10 Angstroms to approximately 30 Angstroms, and may be formed by a CVD process, as explained above in connection with second secondary dielectric layer 36. Alternatively, final secondary dielectric layer 44 may be of $Si_3N_4$. The thickness of final secondary dielectric layer 44, if of $Si_3N_4$, may be approximately 10 to 50 Angstroms. After deposition of final secondary dielectric layer 44 of $Si_3N_4$, a thermal oxidation step may optionally be performed. The optional thermal oxidation step has the effect of forming a thin layer of silicon dioxide on an upper surface of final secondary dielectric layer 44. If the optional thermal oxidation step is to be carried out, then the step of annealing third $Ta_2O_5$ dielectric layer 42 prior to forming of final secondary dielectric layer 44 need not be carried out. Rather, the annealing and oxidation of third $Ta_2O_5$ dielectric layer 42 will occur during the step of oxidation of final secondary dielectric layer 44, as oxygen will diffuse through final secondary dielectric layer 44 to third $Ta_2O_5$ dielectric layer 42.

The steps of providing a secondary dielectric layer and then forming a primary dielectric layer thereon may be repeated as many times as desired. A structure having, for example, six primary dielectric layers may be fabricated by the method of the invention. Each such primary dielectric layer is annealed in an oxygen-bearing ambient, either in a separate annealing step for each layer, or for a selected number of primary dielectric layers, or in a single annealing step for an entire structure. The thickness of each primary dielectric layer is selected to be less than about 100 Angstroms. After annealing, each primary dielectric layer is thus in the first polycrystalline state, characterized by low leakage current.

The secondary dielectric layers in a multi-layer structure need not all be of the same material. Materials that may be used as secondary dielectrics include $SiO_2$, $Si_3N_4$, $TiO_2$, and $Al_2O_3$. For example, referring to FIG. 20, secondary dielectric layers 32 and 44 may comprise $SiO_2$, and secondary dielectric layers 36 and 40 may comprise $TiO_2$.

Figure 21:
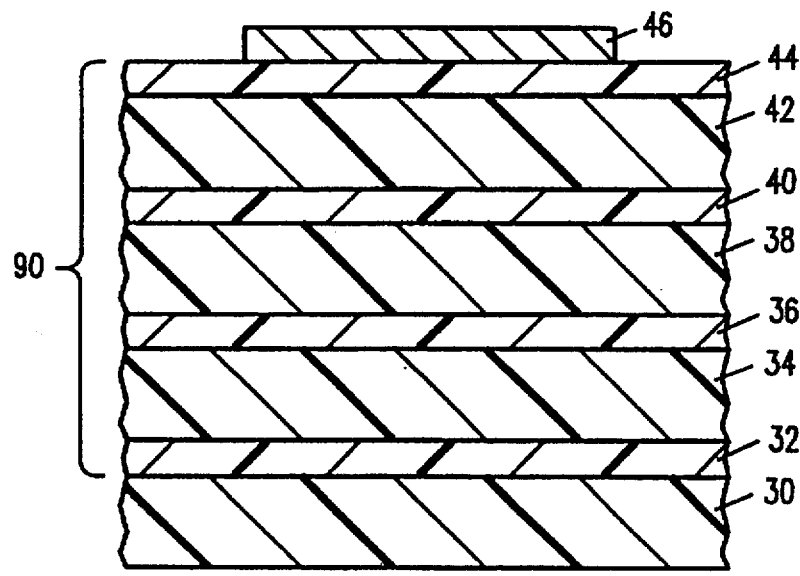
FIG. 21 is a sectional view, similar to FIG. 20, after a step of providing of an electrode.

Referring now to FIG. 21, there is shown electrode 46 provided on final secondary dielectric layer 44. Electrode 46 may be formed by conventional metallization (or polysilicon deposition and doping) and patterning steps, and may comprise any one of a large number of conventional metals, such as tungsten and TiN, or doped polysilicon, that are used as electrode materials. Optional final secondary dielectric layer 44 is advantageous in that it tends to prevent the diffusion of metal atoms into third $Ta_2O_5$ dielectric layer 42 during the step of metallizing and the diffusion of dopant atoms into third $Ta_2O_5$ dielectric layer during the step of doping of deposited polysilicon.

FIG. 21 illustrates a highly advantageous dielectric structure 90. This structure comprises alternating layers of primary dielectric, $Ta_2O_5$, and secondary dielectrics, in the preferred embodiment, $SiO_2$, wherein each $Ta_2O_5$ layer 34, 38, 42 in a first polycrystalline state characterized by low leakage current. In general, the providing of a $Ta_2O_5$ layer in a first polycrystalline state is achieved by depositing each of the $Ta_2O_5$ layers having a thickness of preferably less than approximately 100 Angstroms and then annealing each $Ta_2O_5$ layer. It is possible to form the layers, and then anneal after forming a final layer, without the need to anneal after the forming of each primary dielectric layer individually. It will be understood, as noted above, that separate secondary dielectric layers may comprise different dielectrics. Each secondary dielectric layer may have a thickness of between about 10 Angstroms and about 50 Angstroms. It will be understood that a dielectric structure according to the invention may be provided, having only two $Ta_2O_5$ dielectric layers.

Figure 22:
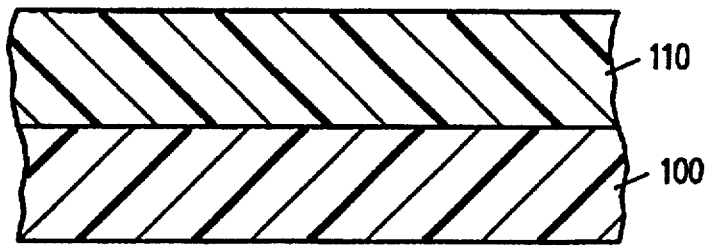
FIG. 22 is a sectional view of a first step in an alternate embodiment of a method according to the invention.

Referring to FIGS. 22–25, there will now be described an alternative method of fabricating a multi-layer metal oxide dielectric structure according to the invention. Referring to FIG. 22, there is shown a substrate 100 having first primary dielectric layer 110 provided thereon. Substrate 100 may be a conventional substrate of silicon, polysilicon or metal. First primary dielectric layer 110 is a metal oxide having a high dielectric constant, and is preferably a $Ta_2O_5$ layer having a thickness of less than about 100 Angstroms. First primary layer 110 is preferably formed by CVD techniques as explained above.

Figure 23:
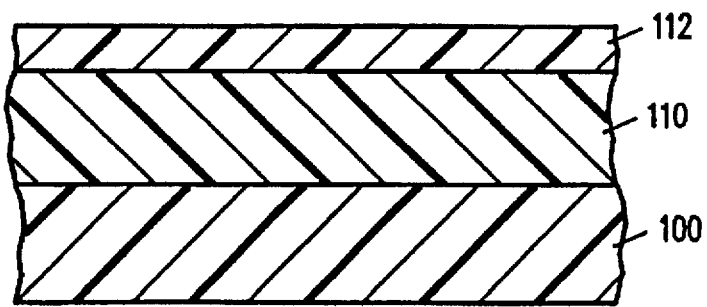
FIG. 23 is a sectional view, similar to FIG. 22, after a step of providing a secondary dielectric layer.

Referring now to FIG. 23, there is formed on first primary dielectric layer 110 first secondary dielectric layer 112. First secondary dielectric layer 112 may be any of $SiO_2$, $Si_3N_4$, $TiO_2$, and $Al_2O_3$. First secondary dielectric layer 112 may be formed by conventional techniques, such as CVD. The thickness of first secondary dielectric layer 112 may be from about 10 to about 30 Angstroms.

After formation of first secondary dielectric layer 112, the steps of forming primary dielectric layers, similar to first primary dielectric layer 110, and then forming on each such primary dielectric layer a secondary dielectric layer, similar to first secondary dielectric layer 112, are repeated. These steps may be repeated as many times as desired.

Figure 24:
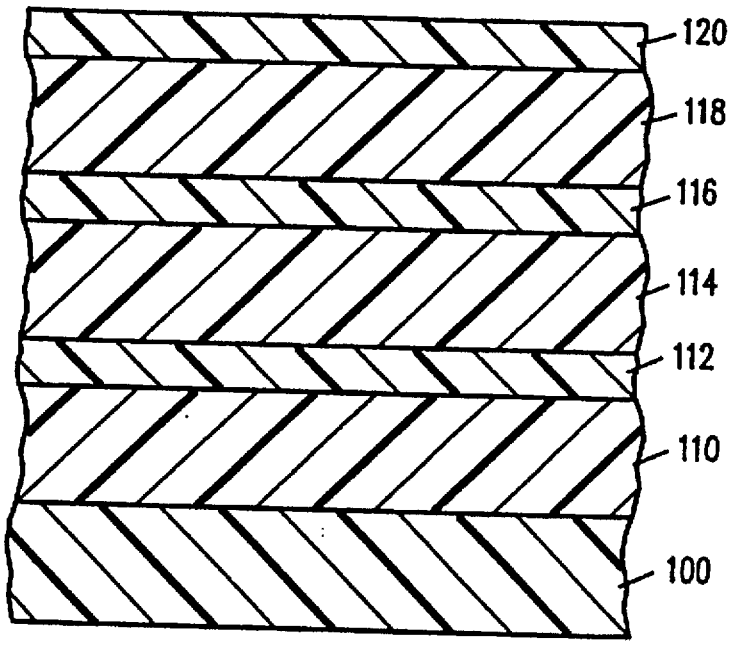
FIG. 24 is a sectional view, similar to FIG. 23, after repeatedly providing primary dielectric layers and secondary dielectric layers.

Referring to FIG. 24, second primary dielectric layer 114, has been formed on secondary dielectric layer 112. Second secondary dielectric layer 116 has been formed on second primary dielectric layer 114. Third primary dielectric layer 118 has been formed on second secondary dielectric layer 116. Final secondary dielectric layer 120 has been provided on third primary dielectric layer 118. Primary dielectric layers 114 and 118 are preferably identical to, and are formed by the same processes as, first primary dielectric layer 110. Secondary dielectric layers 116, 120 are preferably identical to, and are formed by the same processes as, first secondary dielectric layer 112. As noted above in connection with FIG. 20, different dielectrics may be used for separate secondary dielectric layers. Final secondary dielectric layer 120 is preferably of silicon nitride.

Figure 25:
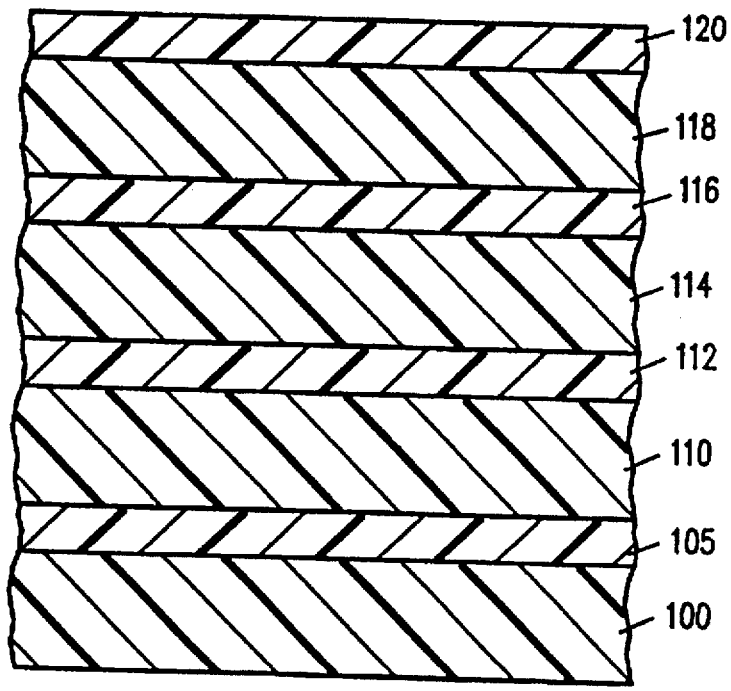
FIG. 25 is a sectional view, similar to FIG. 24, after a step of annealing.

The next step is the annealing of the structure of FIG. 24 in an oxygen-bearing ambient. This step of annealing may be performed in the same manner as in connection with FIGS. 8 and 9 above. This step of annealing can be performed in a single step, for all of the primary dielectric layers, as a final annealing step. During the annealing process, referring now to FIG. 25, an interface dielectric layer 105, will form as a result of the oxidation of substrate 100, between substrate 100 and first primary dielectric layer 110. Interface dielectric layer 105 comprises silicon dioxide, if substrate 100 is of silicon. Thus, it is not necessary to provide a separate step to form a secondary dielectric layer on the substrate below the first primary dielectric layer. During the annealing, each primary dielectric layer is transformed into a first crystalline state characterized by a low leakage current. Thus, the structure of FIG. 25 is a dielectric structure having a high dielectric constant and a low leakage current.

It has been observed by the inventors that a threshold thickness exists, between 100 Angstroms and 200 Angstroms. Below that threshold thickness, a deposited $Ta_2O_5$ layer, when annealed in an oxygen-bearing or inert ambient will be transformed into a first crystalline state characterized by a low leakage current. Above that threshold thickness, a deposited $Ta_2O_5$ film, when annealed in an oxygen-bearing or inert ambient, will be transformed into a second crystalline state characterized by a high leakage current. It is possible that as-yet-unknown modifications to the preferred methods of depositing and annealing $Ta_2O_5$ films will result in a different threshold thickness. It is submitted that the invention, wherein multiple $Ta_2O_5$ layers are provided, pertains to any structure where the $Ta_2O_5$ layers are in the first crystalline state, regardless of the thickness of the individual layers.

It is believed that this invention is not limited to use with $Ta_2O_5$. It is believed that the method and structure of the invention will be applicable to other similar metal oxide films having high dielectric strength or a high dielectric constant. By a high dielectric constant, a dielectric constant at least twice that of $SiO_2$ is intended. Such metal oxide films include niobium oxide ($Nb_2O_5$), titanium oxide ($TiO_2$) and aluminum oxide ($Al_2O_3$). Thus, dielectric structure 90 of FIG. 17 may be characterized as a dielectric structure having at least two layers of primary dielectric that is a metal oxide having high dielectric constant, and having alternating between each pair of primary dielectric layers a layer of a secondary dielectric. Each such primary dielectric is in a first crystalline state, characterized by a low leakage current. The first crystalline state is also characterized by at least one of thickness below a threshold, relatively small grain size, and a relatively smooth surface. Each secondary dielectric layer must be of a chemically-different dielectric from the primary dielectrics with which it is in contact. Preferably, the dielectric structure includes at top and bottom layers of a secondary dielectric. However, the top layer may be unnecessary if diffusion of metal or dopant atoms from an electrode can be prevented. It will be understood that not every primary dielectric layer must comprise the same primary dielectric. For example, a first primary dielectric layer could be of $Ta_2O_5$, and a second primary dielectric layer could be of $Nb_2O_5$.

It is believed that other annealed metal oxide dielectric films in a first crystalline state, which exhibits relatively low leakage current for a given applied field, will be characterized by at least one of the properties of relative film thinness, relatively small grain size, and relative surface smoothness. If film thickness is critical, it is possible that the threshold film thickness for such metal oxide dielectrics will be different than that obtained in the described preferred embodiment using $Ta_2O_5$. If surface roughness is critical, it is possible that the typical mean surface grain roughness will be different, for both the first polycrystalline state and the second polycrystalline state in such other metal oxide dielectrics, from the mean surface grain roughness observed in $Ta_2O_5$ films. If grain size is critical, the typical grain sizes for the first and second crystalline states for other metal oxides may differ from those for $Ta_2O_5$. However, the use of two or more layers of a metal oxide dielectric having a first polycrystalline state, would be considered to fall within the scope of the invention.

The dielectric structure according to the invention will have application in many areas. For example, the dielectric structure of the invention may be a control gate dielectric for EPROM, EEPROM, or Flash cells. The dielectric structure of the invention may also find application in thin-film transistors in flat panel displays and deep sub-micron MOS transistor gate dielectrics.

It will be appreciated that there are considerable variations that can be accomplished in a method and structure of the invention without departing from its scope. As a result, although a preferred embodiment of a method and structure of the invention have been described above, it is emphasized that the invention is not limited to a preferred embodiment and there exists alternative embodiments that are fully encompassed within the invention's scope, which is intended to be limited only by the scope of the appended claims.

What is claimed is:

1. A method of providing a dielectric structure on a substrate, comprising the steps of:
   (a) providing a first layer of a primary dielectric on the substrate, said primary dielectric being a metal oxide having a high dielectric constant selected from the group consisting of $Ta_2O_5$, $TiO_2$, $Nb_2O_5$ and $Al_2O_3$;
   (b) providing a first secondary dielectric layer on said first primary dielectric layer;
   (c) annealing said first primary dielectric layer in an oxygen-bearing ambient:
   (d) providing a second layer of said primary dielectric on said first secondary dielectric layer;
   (e) providing a second layer of said secondary dielectric on said second primary dielectric layer; and
   (f) annealing said second layer of said primary dielectric; wherein after said step of annealing each of said layers of said primary dielectric has a polycrystalline structure characterized by mean surface roughness of less than about 5 to 7 Angstroms.

2. A method as recited in claim 1, further comprising the step of providing an interface secondary dielectric layer on the substrate and below said first primary dielectric layer.

3. A method as recited in claim 1, further comprising the step of forming an oxide layer on said substrate and below said first primary dielectric layer simultaneously with said step (c).

4. A method as recited in claim 1, wherein each of said steps of providing a secondary dielectric layer comprises providing a secondary dielectric layer having a thickness between approximately 10 Angstroms and approximately 50 Angstroms.

5. A method as recited in claim 1, wherein each of said steps of providing a secondary dielectric layer comprises providing a layer of a substance selected from the group consisting of $SiO_2$, $Si_3N_4$, $TiO_2$, and $Al_2O_3$.

6. A method as recited in claim 1, further comprising the step of providing an interface secondary dielectric layer on the substrate and below said first primary dielectric layer.

7. A method as recited in claim 1, further comprising the step of forming an oxide layer on said substrate and below said first primary dielectric layer simultaneously with said step (c).

8. A method of providing a dielectric structure on a substrate, comprising the steps of:
   (a) providing a first layer of a primary dielectric on the substrate, said primary dielectric being $Ta_2O_5$;
   (b) providing a first secondary dielectric layer on said first primary dielectric layer;
   (c) annealing said first primary dielectric layer in an oxygen-bearing ambient;
   (d) providing a second layer of said primary dielectric on said first secondary dielectric layer;
   (e) providing a second layer of said secondary dielectric on said second primary dielectric layer; and
   (f) annealing said second layer of said primary dielectric; wherein each of said steps of providing a primary dielectric layer comprises forming a layer having a thickness of less than approximately 200 Angstroms.

9. A method as recited in claim 1, wherein each of said steps of providing a primary dielectric layer comprises providing a layer having a thickness of less than approximately 100 Angstroms.

10. A method of forming a capacitor on a substrate wherein the substrate serves as a first electrode, comprising the steps of:
   (a) providing a first layer of a primary dielectric on the substrate, said primary dielectric being a metal oxide having a high dielectric constant;
   (b) providing a first secondary dielectric layer on said first primary dielectric layer;
   (c) providing a second layer of said primary dielectric on said first secondary dielectric layer;
   (d) providing a second secondary dielectric layer on said second primary dielectric layer;
   (e) annealing each of said primary dielectric layers so that each of said primary dielectric layers has a polycrystalline structure characterized by mean surface roughness of less than about 5 to 7 Angstroms; and
   (f) forming a second electrode on a final layer of said secondary dielectric.

11. A method as recited in claim 10, wherein said primary dielectric is selected from the group consisting of $Ta_2O_5$, $TiO_2$, $Nb_2O_5$ and $Al_2O_5$.

12. A method as recited in claim 11, wherein said primary dielectric is $Ta_2O_5$, and each of said steps of providing a primary dielectric layer comprises forming a $Ta_2O_5$ layer having a thickness of less than approximately 200 Angstroms.

13. A method as recited in claim 11, wherein each of said steps of providing a primary dielectric layer comprises forming a $Ta_2O_5$ layer having a thickness of less than approximately 100 Angstroms.

14. A method as recited in claim 10, wherein each of said steps of providing a secondary dielectric layer comprises providing a secondary dielectric layer having a thickness between approximately 10 Angstroms and approximately 50 Angstroms.

15. A method as recited in claim 14, wherein each of said steps of providing a primary dielectric layer comprises forming a $Ta_2O_5$ layer having a thickness of less than approximately 100 Angstroms.

16. A method as recited in claim 15, wherein each of said steps of annealing comprises the step of annealing in an oxygen bearing ambient.

17. A method as recited in claim 10, wherein each of said steps of providing a secondary dielectric layer comprises providing a layer of a substance selected from the group consisting of $SiO_2$, $Si_3N_4$, $TiO_2$, and $Al_2O_3$.

18. A method as recited in claim 10, wherein each of said annealed layers of said primary dielectric has a crystalline structure characterized by relatively small grain size.

* * * * *

UNITED STATES PATENT AND TRADEMARK OFFICE
CERTIFICATE OF CORRECTION

PATENT NO. : 5,688,724
DATED : November 18, 1997
INVENTOR(S) : Euisik Yoon et al.

It is certified that error appears in the above-identified patent and that said Letters Patent is hereby corrected as shown below:

In Col. 14, line 45, delete "1" and replace with --8--.

Signed and Sealed this

Twenty-seventh Day of January, 1998

Attest:

BRUCE LEHMAN

Attesting Officer     Commissioner of Patents and Trademarks